United States Patent
Nakafuji et al.

(10) Patent No.: US 9,134,611 B2
(45) Date of Patent: *Sep. 15, 2015

(54) COMPOSITION FOR FORMING RESIST UNDERLAYER FILM AND PATTERN-FORMING METHOD

(71) Applicant: JSR CORPORATION, Tokyo (JP)

(72) Inventors: Shin-ya Nakafuji, Tokyo (JP); Shin-ya Minegishi, Tokyo (JP); Takanori Nakano, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/061,808

(22) Filed: Oct. 24, 2013

(65) Prior Publication Data

US 2014/0048512 A1 Feb. 20, 2014

Related U.S. Application Data

(63) Continuation of application No. PCT/JP2011/060489, filed on Apr. 28, 2011.

(51) Int. Cl.

| | |
|---|---|
| G03F 7/09 | (2006.01) |
| G03F 7/30 | (2006.01) |
| G03F 7/36 | (2006.01) |
| C08G 8/20 | (2006.01) |
| B44C 1/22 | (2006.01) |
| C08G 61/02 | (2006.01) |

(52) U.S. Cl.
CPC .............. *G03F 7/091* (2013.01); *B44C 1/227* (2013.01); *C08G 8/20* (2013.01); *C08G 61/02* (2013.01); *G03F 7/094* (2013.01); *G03F 7/30* (2013.01); *G03F 7/36* (2013.01); *C08G 2261/314* (2013.01); *C08G 2261/332* (2013.01); *C08G 2261/90* (2013.01)

(58) Field of Classification Search
None
See application file for complete search history.

(56) References Cited

U.S. PATENT DOCUMENTS 8,715,916 B2 * 5/2014 Minegishi et al. ............ 430/323
2010/0104977 A1 * 4/2010 Hatakeyama et al. ..... 430/271.1

FOREIGN PATENT DOCUMENTS

| JP | 2000-143937 | 5/2000 |
|---|---|---|
| JP | 2001-040293 | 2/2001 |
| JP | 2006-285095 | 10/2006 |
| JP | 2008-065303 | 3/2008 |
| JP | 2008-292975 | 12/2008 |
| JP | 2010-134437 | 6/2010 |
| JP | 2010-230773 | 10/2010 |
| JP | 2010-262980 | 11/2010 |
| JP | 2011-053643 | 3/2011 |

OTHER PUBLICATIONS

Japanese Office Action for corresponding JP Application No. 2010-045395, Dec. 3, 2013.
International Search Report for corresponding International Application No. PCT/JP2011/060489, May 31, 2011.

* cited by examiner

*Primary Examiner* — Sin Lee
(74) *Attorney, Agent, or Firm* — Oblon, McClelland, Maier & Neustadt, L.L.P.

(57) ABSTRACT

A composition for forming a resist underlayer film includes a polymer having a repeating unit represented by a following formula (1), and a solvent. $R^1$ represents a hydroxy group, or the like. n is an integer of 0 to 5. X represents a divalent hydrocarbon group having 1 to 20 carbon atoms or an alkanediyloxy group having 1 to 20 carbon atoms. m is an integer of 1 to 7. A sum of m and n is no greater than 7. $R^2$ represents a single bond or an alkanediyl group having 1 to 4 carbon atoms. $R^3$ represents an alicyclic group having 4 to 20 carbon atoms or an aryl group having 6 to 30 carbon atoms. A part or all of hydrogen atoms included in the alicyclic group or the aryl group represented by $R^3$ are unsubstituted or substituted.

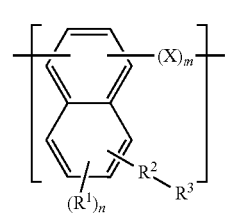

(1)

16 Claims, No Drawings

COMPOSITION FOR FORMING RESIST UNDERLAYER FILM AND PATTERN-FORMING METHOD

CROSS-REFERENCE TO RELATED APPLICATIONS

The present application is a continuation application of International Application No. PCT/JP2011/060489, filed Apr. 28, 2011. The contents of this application are incorporated herein by reference in their entirety.

BACKGROUND OF THE INVENTION

1. Field of the Invention

The present invention relates to a composition for forming a resist underlayer film, and a pattern-forming method.

2. Discussion of the Background

Substrates used for semiconductor devices have an intended pattern. A process for patterning the substrate includes, for example, the steps of: depositing a photosensitive substance, called a resist composition, on the substrate to provide a resist film; exposing a predetermined region of the resist film; developing the resist film and removing a light-exposed site or a light-unexposed site to obtain a predetermined resist pattern; dry etching the substrate by using the obtained resist pattern as an etching mask; and the like.

In such a patterning process, ultraviolet rays such as an ArF excimer laser beam are used as a source of exposure lights for exposing the resist film; however, demands for microfabrication of large scale integrated circuits (LSIs) are increasingly growing in these days, and a required resolution has reached a level of no higher than the wavelength of the exposure lights (ultraviolet rays). In the case of the required resolution being at a level of no higher than the wavelength of the exposure lights, as just described, an exposure process latitude such as an exposure dose latitude and a focus latitude tends to be insufficient. In order to compensate for such an insufficient exposure process latitude, it is effective to improve the resolution by decreasing the film thickness of the resist film; however, when the film thickness is decreased, it may become difficult to secure a resist film thickness necessary for etching the substrate.

Thus, a process including providing a resist underlayer film between a substrate and a resist film, once transferring a resist pattern to the underlayer film to form an underlayer film pattern, and thereafter transferring a pattern to the substrate by means of the underlayer film pattern as an etching mask has been investigated.

As a composition for providing the aforementioned resist underlayer film, a composition composed of a component that exhibits etching resistance is preferred, for example, a composition containing a polymer that has a high carbon content and includes an aromatic ring that absorbs energies during the etching, e.g., heat curable phenol novolak, a composition containing a polymer having an acenaphthylene skeleton, and the like have been proposed (see Japanese Unexamined Patent Application, Publication Nos. 2001-40293 and 2000-143937). In addition, a composition containing a copolymer of a styrene derivative or an allylbenzene derivative with a nortricyclene derivative, or the like has been also proposed (see Japanese Unexamined Patent Application, Publication No. 2008-65303).

SUMMARY OF THE INVENTION

According to one aspect of the present invention, a composition for forming a resist underlayer film includes a polymer having a repeating unit represented by a following formula (1), and a solvent.

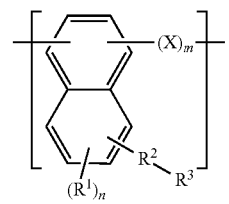

In the formula (1), $R^1$ represents a hydroxy group, an alkyl group having 1 to 6 carbon atoms, an alkoxy group having 1 to 6 carbon atoms, an acyl group having 2 to 10 carbon atoms or an aryl group having 6 to 14 carbon atoms; n is an integer of 0 to 5, wherein in a case where n is no less than 2, a plurality of $R^1$s are identical or different; X represents a divalent hydrocarbon group having 1 to 20 carbon atoms or an alkanediyloxy group having 1 to 20 carbon atoms; m is an integer of 1 to 7, wherein in a case where m is no less than 2, a plurality of Xs are identical or different; a sum of m and n is no greater than 7; $R^2$ represents a single bond or an alkanediyl group having 1 to 4 carbon atoms; and $R^3$ represents an alicyclic group having 4 to 20 carbon atoms or an aryl group having 6 to 30 carbon atoms, wherein a part or all of hydrogen atoms included in the alicyclic group or the aryl group represented by $R^3$ are unsubstituted or substituted with a hydroxy group, an alkyl group having 1 to 6 carbon atoms, an alkoxy group having 1 to 6 carbon atoms, an acyl group having 1 to 6 carbon atoms or a hydroxyalkyl group having 1 to 6 carbon atoms.

According to another aspect of the present invention, a pattern-forming method includes coating the composition on a substrate, to provide a resist underlayer film. A resist pattern is formed on the substrate using a resist composition. The substrate has the resist underlayer film provided on the substrate. The resist underlayer film and the substrate are etched.

DESCRIPTION OF THE EMBODIMENTS

An embodiment of the present invention which was made for solving the foregoing problems relates to a composition for forming a resist underlayer film, containing:

(A) a polymer having a repeating unit represented by the following formula (1) (hereinafter, may be also referred to as "(A) polymer"); and (B) a solvent,

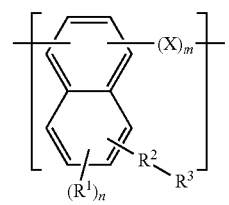

wherein, in the formula (1), $R^1$ represents a hydroxy group, an alkyl group having 1 to 6 carbon atoms, an alkoxy group having 1 to 6 carbon atoms, an acyl group having 2 to 10 carbon atoms or an aryl group having 6 to 14 carbon atoms; n is an integer of 0 to 5, wherein in a case where n is no less than 2, a plurality of $R^1$s are identical or different; X represents a divalent hydrocarbon group having 1 to 20 carbon atoms or an alkanediyloxy group having 1 to 20 carbon atoms; m is an integer of 1 to 7, wherein in a case where m is no less than 2, a plurality of Xs are identical or different; additionally, a sum of m and n is no greater than 7; $R^2$ represents a single bond or an alkanediyl group having 1 to 4 carbon atoms; and $R^3$ represents an alicyclic group having 4 to 20 carbon atoms or an aryl group having 6 to 30 carbon atoms, wherein a part or all of hydrogen atoms included in $R^3$ are unsubstituted or substituted with a hydroxy group, an alkyl group having 1 to 6 carbon atoms, an alkoxy group having 1 to 6 carbon atoms, an acyl group having 1 to 6 carbon atoms or a hydroxyalkyl group having 1 to 6 carbon atoms.

The above formula (1) is preferably represented by the following formula (1-1):

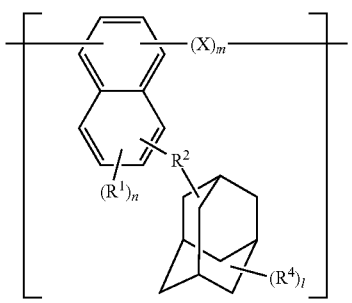

(1-1)

wherein, in the formula (1-1), $R^1$, $R^2$, X, m and n are as defined in the above formula (1); $R^4$ represents a hydroxy group, an alkyl group having 1 to 6 carbon atoms, an alkoxy group having 1 to 6 carbon atoms, an acyl group having 2 to 6 carbon atoms or a hydroxyalkyl group having 1 to 6 carbon atoms; and l is an integer of 0 to 3, wherein in a case where l is no less than 2, a plurality of $R^4$s are identical or different.

The weight average molecular weight of the polymer (A) is preferably 500 to 8,000.

It is preferred that the composition for forming a resist underlayer film further contains (C) an acid generating agent.

It is preferred that the composition for forming a resist underlayer film further contains (D) a crosslinking agent.

According to another embodiment of the present invention, a pattern-forming method includes: coating the composition for forming a resist underlayer film according to the embodiment of the present invention on a substrate to provide a resist underlayer film; forming a resist pattern on the substrate using a resist composition, the substrate having the resist underlayer film provided thereon; and etching the resist underlayer film and the substrate.

According to the composition for forming a resist underlayer film according to the embodiments of the present invention, a resist underlayer film can be provided that has superior etching resistance, and a reduced reflectance attributable to a high refractive index n and a low extinction coefficient k. In addition, according to the pattern-forming method according to the embodiments of the present invention, a pattern having a superior pattern configuration can be formed reproducibly.

The embodiments will now be described in detail, but the present invention is not limited to the following embodiments.

Composition for Forming a Resist Underlayer Film

The composition for forming a resist underlayer film according to the embodiment of the present invention contains (A) a polymer and (B) a solvent. In addition, the composition for forming a resist underlayer film preferably contains (C) an acid generating agent and (D) a crosslinking agent. Furthermore, the composition for forming a resist underlayer film may contain other optional component within a range not leading to impairment of the effects of the present invention. Hereinafter, each component will be explained in more detail.

(A) Polymer

The polymer (A) has a repeating unit represented by the above formula (1) (hereinafter, may be also referred to as "repeating unit (I)").

Repeating Unit (I)

In the above formula (1), $R^1$ represents a hydroxy group, an alkyl group having 1 to 6 carbon atoms, an alkoxy group having 1 to 6 carbon atoms, an acyl group having 2 to 10 carbon atoms or an aryl group having 6 to 14 carbon atoms; n is an integer of 0 to 5, wherein in a case where n is no less than 2, a plurality of $R^1$s are identical or different; X represents a divalent hydrocarbon group having 1 to 20 carbon atoms or an alkanediyloxy group having 1 to 20 carbon atoms; m is an integer of 1 to 7, wherein in a case where m is no less than 2, a plurality of Xs are identical or different; additionally, a sum of m and n is an integer of 1 to 7; $R^2$ represents a single bond or an alkanediyl group having 1 to 4 carbon atoms; and $R^3$ represents an alicyclic group having 4 to 20 carbon atoms or an aryl group having 6 to 30 carbon atoms, wherein a part or all of hydrogen atoms included in $R^3$ are unsubstituted or substituted with a hydroxy group, an alkyl group having 1 to 6 carbon atoms, an alkoxy group having 1 to 6 carbon atoms, an acyl group having 1 to 6 carbon atoms or a hydroxyalkyl group having 1 to 6 carbon atoms.

In the above formula (1), examples of the alkyl group having 1 to 6 carbon atoms represented by $R^1$ include a methyl group, an ethyl group, a propyl group, an isopropyl group, a butyl group, an isobutyl group, a tert-butyl group, and the like.

Examples of the alkoxy group having 1 to 6 carbon atoms represented by $R^1$ include a methoxy group, an ethoxy group, a propoxy group, an isopropoxy group, a butoxy group, an isobutoxy group, a tert-butoxy group, and the like.

Examples of the acyl group having 2 to 10 carbon atoms represented by $R^1$ include an aliphatic acyl group such as an acetyl group, an aromatic acyl group, and the like.

Examples of the aryl group having 6 to 14 carbon atoms represented by $R^1$ include a phenyl group, a naphthyl group, and the like.

In addition, a part or all of hydrogen atoms included in $R^1$ are unsubstituted or substituted with a substituent. Examples of the substituent include a nitro group, an amino group, a carboxyl group, a sulfonic acid group, a mercapto group, a hydroxymethyl group, an ester group, an epoxy group, and the like.

In the above formula (1), $R^1$ is preferably a hydroxy group.

In the above formula (1), examples of the divalent hydrocarbon group represented by X include an alkanediyl group, an arylene group, and the like. In addition, the hydrocarbon group may include a substituent. The definition of the substituent which is optionally included in $R^1$ described above may be applied to the substituent which is optionally included in the hydrocarbon group.

Examples of the alkanediyl group include a methylene group, an ethylene group, and the like.

The arylene group is preferably an arylene group having 6 to 14 carbon atoms, and examples thereof include a phenylene group, a naphthylene group, and the like.

Examples of the alkanediyloxy group having 1 to 20 carbon atoms represented by X include a methyleneoxy group, an ethyleneoxy group, and the like.

In the above formula (1), examples of the alkanediyl group represented by $R^2$ include a methylene group, an ethylene group, and the like.

In the above formula (1), examples of the alicyclic group having 4 to 20 carbon atoms represented by $R^3$ include a cyclobutanediyl group, a cyclopentanediyl group, and the like.

Examples of the aryl group having 6 to 30 carbon atoms represented by R include a phenyl group, a naphthyl group, and the like. The substituent which is optionally included in the alicyclic group and aryl group is preferably a hydroxy group.

In the above formula (1), examples of the group represented by —$R^2$-$R^3$ preferably include groups represented by the following formulae. Note that, in the formulae, * denotes a bonding site to the aromatic ring.

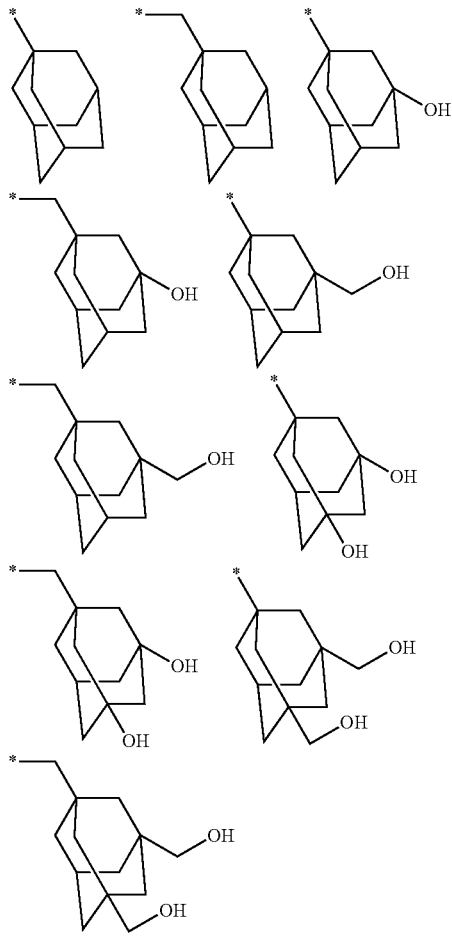

The repeating unit (I) is preferably the repeating unit represented by the above formula (1-1).

In the above formula (1-1), $R^1$, $R^2$, X, m and n are as defined in the above formula (1); $R^4$ represents a hydroxy group, an alkyl group having 1 to 6 carbon atoms or a hydroxyalkyl group having 1 to 6 carbon atoms; and l is an integer of 0 to 3, wherein in a case where l is no less than 2, a plurality of $R^4$s are identical or different.

In the above formula (1-1), examples of the alkyl group having 1 to 6 carbon atoms represented by $R^4$ include a methyl group, an ethyl group, a propyl group, a butyl group, and the like.

Examples of the alkoxy group having 1 to 6 carbon atoms represented by $R^4$ include the same groups as those exemplified as the alkoxy group having 1 to 6 carbon atoms represented by $R^1$ in the above formula (1).

Examples of the acyl group having 2 to 6 carbon atoms represented by $R^4$ include an aliphatic acyl group such as an acetyl group, an aromatic acyl group, and the like.

Examples of the hydroxyalkyl group having 1 to 6 carbon atoms represented by $R^4$ include the same groups as those exemplified just above as the alkyl group having 1 to 6 carbon atoms except that a part or all of hydrogen atoms included in those exemplified as the alkyl group having 1 to 6 carbon atoms are substituted with a hydroxy group, and the like.

In the above formula (1-1), $R^4$ is preferably a hydroxy group and a hydroxymethyl group; and l is preferably 0 to 2.

The polystyrene equivalent weight average molecular weight (Mw) of the polymer (A) as determined by gel permeation chromatography (GPC) is preferably 500 to 8,000, more preferably 1,000 to 3,000, and still more preferably 1,500 to 2,500. When the Mw is less than 500, the component may be volatilized during the baking of the resist underlayer film, leading to failure to attain a desired film thickness. On the other hand, when the Mw is greater than 8,000, solubility in the solvent (B) may be decreased.

Synthesis Method of Polymer (A)

Synthesis method of the polymer (A) includes: a method in which a naphthalene derivative, an aldehyde and an alcohol represented by the following formula (2) are heated under solvent-free conditions or in a solvent in the presence of an acid catalyst; a method in which introduction of an alcohol represented by the following formula (2) into a polymer after the polymerization is carried out in the presence of an acid catalyst; and the like. Furthermore, polymerization may be carried out using a naphthol compound having as a pendant a group represented by —$R^2$-$R^3$, which is obtained by reacting the alcohol represented by the following formula (2) with a monomer before the polymerization, e.g., naphthol.

In the above formula (2), $R^2$ and $R^3$ are as defined in the above formula (1).

The alcohol represented by the above formula (2) is preferably 1-adamantanol, 1-adamantanemethanol, 1,3-adamantanedimethanol, 1,3-adamantanediol, 1,3,5-adamantanetrimethanol and 1,3,5-adamantanetriol.

Examples of the aldehyde include saturated aliphatic aldehydes such as formaldehyde, paraformaldehyde, acetaldehyde and propylaldehyde; unsaturated aliphatic aldehydes such as acrolein and methacrolein; heterocyclic aldehydes such as furfural; aromatic aldehydes such as benzaldehyde, naphthylaldehyde and anthraldehyde; and the like. Among these, formaldehyde, paraformaldehyde, and furfural are preferred. Note that these aldehydes may be used either alone, or as a mixture of two or more thereof.

The amount of the aldehyde and alcohol used in the synthesis method with respect to 100 parts by mass of the naphthalene derivative is preferably 10 to 100 parts by mass of the aldehyde and 10 to 100 parts by mass of the alcohol.

Examples of the acid catalyst used in the synthesis method include mineral acids such as sulfuric acid, phosphoric acid and perchloric acid; organic sulfonic acids such as p-toluenesulfonic acid; carboxylic acids such as formic acid and oxalic acid; and the like. In addition, the amount of the acid catalyst used is variously selected in accordance with the type of the acid used. For example, the amount of the acid catalyst with respect to 100 parts by mass of acenaphthylenes is preferably 0.001 to 10,000 parts by mass, and more preferably 0.01 to 1,000 parts by mass.

The reaction temperature in the synthesis method is preferably 40° C. to 200° C. The reaction time may be variously selected in accordance with the reaction temperature, but is preferably 30 min to 72 hrs.

In the composition for forming a resist underlayer film according to the embodiment of the present invention, the content of the polymer (A) is preferably 8 to 30% by mass with respect to 100% by mass the total of the polymer (A) and the solvent (B).

(B) Solvent

The composition for forming a resist underlayer film according to the embodiment of the present invention includes (B) a solvent that dissolves the polymer (A). The solvent for use in the composition for forming a resist underlayer film of the embodiment of the present invention is not particularly limited as long as it can dissolve the polymer (A), and examples thereof include:

ethylene glycol monoalkyl ethers such as ethylene glycol monomethyl ether, ethylene glycol monoethyl ether, ethylene glycol mono-n-propyl ether, and ethylene glycol mono-n-butyl ether;

ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

diethylene glycol dialkyl ethers such as diethylene glycol dimethyl ether, diethylene glycol diethyl ether, diethylene glycol di-n-propyl ether, and diethylene glycol di-n-butyl ether;

triethylene glycol dialkyl ethers such as triethylene glycol dimethyl ether, and triethylene glycol diethyl ether;

propylene glycol monoalkyl ethers such as propylene glycol monomethyl ether, propylene glycol monoethyl ether, propylene glycol mono-n-propyl ether, and propylene glycol mono-n-butyl ether;

propylene glycol dialkyl ethers such as propylene glycol dimethyl ether, propylene glycol diethyl ether, propylene glycol di-n-propyl ether, and propylene glycol di-n-butyl ether;

propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactic acid esters such as methyl lactate, ethyl lactate, n-propyl lactate, i-propyl lactate, n-butyl lactate, and i-butyl lactate;

aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate;

other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate, and ethyl pyruvate;

aromatic hydrocarbons such as toluene, and xylene;

ketones such as methyl ethyl ketone, methyl n-propyl ketone, methyl n-butyl ketone, 2-heptanone, 3-heptanone, 4-heptanone, and cyclohexanone;

amides such as N-methylformamide, N,N-dimethylformamide, N-methylacetamide, N,N-dimethylacetamide, and N-methylpyrrolidone;

lactones such as γ-butyrolactone; and the like. These may be appropriately selected and used.

Among these solvents (B), propylene glycol monomethyl ether, propylene glycol methyl ether acetate, ethylene glycol monoethyl ether acetate, ethyl lactate, n-butyl acetate, ethyl 3-ethoxypropionate, methyl 3-methoxypropionate, 2-heptanone, cyclohexanone, and γ-butyrolactone are preferred. Note that these solvents (B) may be used either alone, or as a mixture of two or more thereof.

The amount of the solvent (B) used is such an amount that a solid content concentration of the resultant composition is preferably 5 to 80% by mass, more preferably 5 to 40% by mass, and still more preferably 10 to 30% by mass. Note that the "solid content" as referred to means a component other than the solvent contained in the composition for forming a resist underlayer film of the embodiment of the present invention.

(C) Acid Generating Agent

The composition for forming a resist underlayer film contains (C) an acid generating agent as a favorable component. The acid generating agent (C) generates an acid upon exposure or heating.

Examples of the acid generating agent that generates an acid upon exposure (hereinafter, may be also referred to as "photoacid generating agent") include:

onium salt-based photoacid generating agents such as:

diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, diphenyliodonium hexafluoroantimonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, bis(4-t-butylphenyl)iodonium hexafluoroantimonate, triphenylsulfonium trifluoromethanesulfonate, triphenylsulfonium nonafluoro-n-butanesulfonate, triphenylsulfonium n-dodecylbenzenesulfonate, triphenylsulfonium naphthalenesulfonate, triphenylsulfonium 10-camphorsulfonate, triphenylsulfonium hexafluoroantimonate, 4-hydroxyphenylphenylmethylsulfonium p-toluenesulfonate, 4-hydroxyphenylbenzylmethylsulfonium p-toluenesulfonate, cyclohexylmethyl-2-oxocyclohexylsulfonium trifluoromethanesulfonate, 2-oxocyclohexyldicyclohexylsulfonium trifluoromethanesulfonate, 2-oxocyclohexyldimethylsulfonium trifluoromethanesulfonate, 1-naphthyldimethylsulfonium trifluoromethanesulfonate, 1-naphthyldiethylsulfonium trifluoromethanesulfonate, 4-cyano-1-naphthyldimethylsulfonium trifluoromethanesulfonate, 4-cyano-1-naphthyldiethylsulfonium trifluoromethanesulfonate, 4-nitro-1-naphthyldimethylsulfonium trifluoromethanesulfonate, 4-nitro-1-naphthyldiethylsulfonium trifluoromethanesulfonate, 4-methyl-1-naphthyldimethylsulfonium trifluoromethanesulfonate, 4-methyl-1-naphthyldiethylsulfonium trifluoromethanesulfonate, 4-hydroxy-1-naphthyldimethylsulfonium trifluoromethanesulfonate, 4-hydroxy-1-naphthyldiethylsulfonium trifluoromethanesulfonate, 1-(4-hydroxynaphthalen-1-yl)tetrahydrothiophenium trifluoromethanesulfonate, 1-(4-methoxynaphthalen-1-yl)tetrahydrothiophenium trifluoromethanesulfonate, 1-(4-ethoxynaphthalen-1-yl)tetrahydrothiophenium trifluoromethanesulfonate, 1-(4-methoxymethoxynaphthalen-1-yl)tetrahydrothiophenium trifluoromethanesulfonate, 1-(4-ethoxymethoxynaphthalen-1-yl)tetrahydrothiophenium trifluoromethanesulfonate, 1-[4-(1-methoxyethoxy)naphthalen-1-yl]tetrahydrothiophenium trifluoromethanesulfonate, 1-[4-(2-methoxyethoxy)naphthalen-1-yl]tetrahydrothiophenium trifluoromethanesulfonate, 1-(4-methoxycarbonyloxynaphthalen-1-yl)tetrahydrothiophenium trifluoromethanesulfonate, 1-(4-ethoxycarbonyloxynaphthalen-1-yl)tetrahydrothiophenium trifluoromethanesulfonate, 1-(4-n-propoxycarbonyloxynaphthalen-1-yl)tetrahydrothiophenium trifluoromethanesulfonate, 1-(4-i-propoxycarbonyloxynaphthalen-1-yl)tetrahydrothiophenium trifluoromethanesulfonate, 1-(4-n-butoxycarbonyloxynaphthalen-1-yl)tetrahydrothiophenium trifluoromethanesulfonate, 1-(4-t-butoxycarbonyloxynaphthalen-1-yl)tetrahydrothiophenium trifluoromethanesulfonate, 1-[4-(2-tetrahydrofuranyloxy)naphthalen-1-yl]tetrahydrothiophenium trifluoromethanesulfonate, 1-[4-(2-tetrahydropyranyloxy)naphthalen-1-yl]tetrahydrothiophenium trifluoromethanesulfonate, 1-(4-benzyloxy)tetrahydrothiophenium trifluoromethanesulfonate, and 1-(naphthylacetomethyl)tetrahydrothiophenium trifluoromethanesulfonate;

halogen-containing compound-based photoacid generating agents such as phenylbis(trichloromethyl)-s-triazine, 4-methoxyphenylbis(trichloromethyl)-s-triazine, and 1-naphthylbis(trichloromethyl)-s-triazine;

diazo ketone compound-based photoacid generating agents such as 1,2-naphthoquinone diazide-4-sulfonyl chloride, 1,2-naphthoquinone diazide-5-sulfonyl chloride, 1,2-naphthoquinone diazide-4-sulfonic acid ester of 2,3,4,4'-tetrahydroxybenzophenone, and 1,2-naphthoquinone diazide-5-sulfonic acid esters;

sulfone compound-based photoacid generating agents such as 4-trisphenacyl sulfone, mesityl phenacyl sulfone, and bis(phenylsulfonyl)methane;

sulfonic acid compound-based photoacid generating agents such as benzoin tosylate, tris(trifluoromethanesulfonate) of pyrogallol, nitrobenzyl-9,10-diethoxyanthracene-2-sulfonate, trifluoromethanesulfonyl bicyclo[2,2,1]hept-5-ene-2,3-dicarbodiimide, N-hydroxysuccinimide trifluoromethanesulfonate, and 1,8-naphthalenedicarboxylic acid imide trifluoromethanesulfonate; and the like.

Among these photoacid generating agents, diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, and bis(4-t-butylphenyl)iodonium naphthalenesulfonate are preferred. These photoacid generating agents may be used either alone, or as a mixture of two or more thereof.

Examples of the acid generating agent that generates an acid upon heating (hereinafter, may be also referred to as "thermal acid generating agent") include 2,4,4,6-tetrabromocyclohexadienone, benzoin tosylate, 2-nitrobenzyl tosylate, alkylsulfonates, and the like. These thermal acid generating agents may be used either alone, or as a mixture of two or more thereof.

Note that a combination of the photoacid generating agent and the thermal acid generating agent may be used as the acid generating agent (C).

The blend amount of the acid generating agent (C) with respect to 100 parts by mass of the solid content of the composition for forming a resist underlayer film is preferably no greater than 10 parts by mass, and more preferably 0.1 to 5 parts by mass. When the composition for forming a resist underlayer film according to the embodiment of the present invention contains the acid generating agent (C), a crosslinking reaction between the molecular chains of each polymer can be effectively caused at comparatively low temperatures (including a normal temperature).

(D) Crosslinking Agent

The composition for forming a resist underlayer film according to the embodiment of the present invention contains (D) a crosslinking agent as a favorable component. The crosslinking agent (D) prevents intermixing between a resist underlayer film obtained by curing the composition for forming an underlayer film and a resist coating film provided on the resist underlayer film, and furthermore functions to prevent cracks of the resist underlayer film. Polynuclear phenols, various types of commercially available curing agents, and the like may be used as the crosslinking agent (D).

Examples of the polynuclear phenols include binuclear phenols such as 4,4'-biphenyldiol, 4,4'-methylene bisphenol, 4,4'-ethylidenebisphenol, and bisphenol A; trinuclear phenols such as 4,4',4''-methylidene trisphenol and 4,4'-[1-{4-(1-[4-hydroxyphenyl]-1-methylethyl)phenyl}ethylidene] bisphenol; and polyphenols such as novolak. Among these polynuclear phenols, 4,4'-[1-{4-(1-[4-hydroxyphenyl]-1-methylethyl)phenyl}ethylidene]bisphenol, novolak and the like are particularly preferred. The polynuclear phenols may be used either alone, or as a mixture of two or more thereof.

In addition, examples of the curing agents include diisocyanates such as 2,3-tolylene diisocyanate, 2,4-tolylene diisocyanate, 3,4-tolylene diisocyanate, 3,5-tolylene diisocyanate, 4,4'-diphenylmethane diisocyanate, hexamethylene diisocyanate, and 1,4-cyclohexane diisocyanate, and the like.

Examples of the commercially available curing agents include epoxy compounds such as Epicoat 812, 815, 826, 828, 834, 836, 871, 1001, 1004, 1007, 1009, and 1031 (each manufactured by Yuka Shell Epoxy Co., Ltd.), Araldite 6600, 6700, 6800, 502, 6071, 6084, 6097 and 6099 (each manufactured by Ciba-Geigy), D.E.R. 331, 332, 333, 661, 644, and 667 (each manufactured by Dow Chemical Company); melamine-based curing agents such as Cymel 300, 301, 303, 350, 370, 771, 325, 327, 703, 712, 701, 272, and 202, Mycoat 506 and 508 (each manufactured by Mitsui Cyanamid Ltd.); benzoguanamine-based curing agents such as Cymel 1123, 1123-10, and 1128, Mycoat 102, 105, 106, and 130 (each manufactured by Mitsui Cyanamid Ltd.); Cymel 1170 and 1172 (each manufactured by Mitsui Cyanamid Ltd.); glycoluril-based curing agents such as Nikaluck N-2702 (manufactured by Sanwa Chemical Co., Ltd); and the like. Among these curing agents, the melamine-based curing agents, the glycoluril-based curing agents and the like are preferred. The curing agents may be used either alone, or as a mixture of two or more thereof. Furthermore, a combination of the polynuclear phenol and the curing agent may be used as the crosslinking agent.

The blend amount of the crosslinking agent is preferably no greater than 50 parts by mass with respect to 100 parts by mass of the solid content of the composition for forming a resist underlayer film.

Other Optional Component

The composition for forming an underlayer film according to the embodiment of the present invention may contain other optional component in addition to the polymer (A), the solvent (B), the acid generating agent (C) and the crosslinking agent (D). The other optional component preferably functions to prevent intermixing between a resist underlayer film and a resist coating film, improve coating properties of the composition for forming an underlayer film, and the like. Examples of the other optional component include a binder resin, a radioactive ray absorbing agent, a surfactant, and the like.

Various types of thermoplastic resins and thermosetting resins may be used as the binder resin.

Examples of the thermoplastic resins include:

α-olefin polymers such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene, and polyvinylcycloalkane; non-conjugated diene polymers such as poly-1,4-pentadiene, poly-1,4-hexadiene, and poly-1,5-hexadiene;

α,β-unsaturated aldehyde polymers; α,β-unsaturated ketone polymers such as poly(methyl vinyl ketone), poly (aromatic vinyl ketone), and poly(cyclic vinyl ketone); polymers of α,β-unsaturated carboxylic acids or derivatives thereof such as (meth)acrylic acid, α-chloracrylic acid, (meth)acrylic acid salt, (meth)acrylic acid ester, and (meth) acrylic halide; polymers of α,β-unsaturated carboxylic anhydrides such as poly((meth)acrylic anhydride) and copolymers of maleic anhydride; and polymers of unsaturated polybasic carboxylic acid esters such as methylenemalonic acid diester and itaconic acid diester;

polymers of diolefin carboxylic acid esters such as sorbic acid esters and muconic acid esters; polymers of α,β-unsaturated carboxylic acid thioesters such as (meth)acrylic acid thioesters and α-chloroacrylic acid thioesters; polymers of (meth)acrylonitriles or derivatives thereof such as (meth) acrylonitrile and α-chloroacrylonitrile; polymers of (meth) acrylamide or derivatives thereof such as (meth)acrylamide and N,N-dimethyl(meth)acrylamide; polymers of styryl metal compounds; and polymers of vinyloxymetal compounds;

polyimines; polyethers such as polyphenylene oxide, poly-1,3-dioxolane, polyoxirane, polytetrahydrofuran, and polytetrahydropyran; polysulfides; polysulfoneamides; polypeptides; polyamides such as nylon 66, and nylon 1 to nylon 12; polyesters such as aliphatic polyesters, aromatic polyesters, alicyclic polyesters, and polycarbonic acid esters; polyureas; polysulfones; polyazines; polyamines; polyaromatic ketones; polyimides; polybenzimidazoles; polybenzoxazoles; polybenzothiazoles; polyaminotriazoles; polyoxadiazoles; polypyrazoles; polytetrazoles; polyquinoxalines; polytriazines; polybenzoxadinones; polyquinolines; polyanthrazolines; and the like.

In addition, the thermosetting resins are a component that is cured by heating, turns to be insoluble in a solvent, and thereby functions to prevent intermixing between the resultant resist underlayer film and a resist coating film provided thereon. Thus, the thermosetting resins can be preferably used as a binder resin. Examples of the thermosetting resins include thermosetting acrylic resins, phenol resins, urea resins, melamine resins, amino resins, aromatic hydrocarbon resins, epoxy resins, alkyd resins, and the like. Among these thermosetting resins, urea resins, melamine resins, aromatic hydrocarbon resins and the like are preferred.

These binder resins may be used either alone, or as a mixture of two or more thereof. The blend amount of the binder resin is preferably no greater than 20 parts by mass, and more preferably no greater than 10 parts by mass with respect to 100 parts by mass of the solid content of the composition for forming a resist underlayer film.

Examples of the radioactive ray absorbing agent include dyes such as oil-soluble dyes, dispersion dyes, basic dyes, methine dyes, pyrazole dyes, imidazole dyes, and hydroxyazo dyes; fluorescent whitening agents such as bixin derivatives, norbixin, stilbene, 4,4'-diaminostilbene derivatives, coumarin derivatives, and pyrazoline derivatives; ultraviolet ray absorbing agents such as hydroxyazo dyes, Tinuvin 234 (manufactured by Ciba-Geigy), and Tinuvin 1130 (manufactured by Ciba-Geigy); aromatic compounds such as anthracene derivatives and anthraquinone derivatives; and the like. These radioactive ray absorbing agents may be used either alone, or as a mixture of two or more thereof. The blend amount of the radioactive ray absorbing agent is preferably no greater than 100 parts by mass, and more preferably no greater than 50 parts by mass with respect to 100 parts by mass of the solid content of the composition for forming a resist underlayer film.

The surfactant functions to improve coating properties, striation, wettability, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and the like.

Examples of commercially available surfactants include KP341 (manufactured by Shin-Etsu Chemical Co., Ltd.), Polyflow No. 75 and No. 95 (each manufactured by Kyoeisha Chemical Co., Ltd.), F-top EF101, EF204, EF303, and EF352 (each manufactured by Tochem Products Co. Ltd.), Megafac F171, F172, and F173 (each manufactured by Dainippon Ink And Chemicals, Incorporated), Fluorad FC430, FC431, FC135, and FC93 (each manufactured by Sumitomo 3M Ltd.), AsahiGuard AG710, Surflon S382, SC101, SC102, SC103, SC104, SC105, and SC106 (each manufactured by Asahi Glass Co., Ltd.), and the like. These surfactants may be used either alone, or as a mixture of two or more thereof. The blend amount of the surfactant is preferably no greater than 15 parts by mass, and more preferably 10 parts by mass with respect to 100 parts by mass of the solid content of the composition for forming a resist underlayer Furthermore, examples of optional components other than those mentioned above include a storage stabilizer, a defoaming agent, an adhesion promoter, and the like.

Pattern-Forming Method

The pattern-forming method according to the embodiment of the present invention includes: (1) coating the composition for forming a resist underlayer film according to the embodiment of the present invention on a substrate, to provide a resist underlayer film, (2) forming a resist pattern on the substrate using a resist composition, the substrate having the resist underlayer film provided thereon, and (3) etching the resist underlayer film and the substrate. Hereinafter, each step will be explained.

Step (1)

As the substrate, for example, a silicon wafer and a wafer coated with aluminum, and the like can be used. Coating of the underlayer film composition may be carried out by appropriate methods such as spin-coating, cast coating, and roll coating. Thereafter, the coated film is cured by exposure and/or heating. A radioactive ray used for the exposure is appropriately selected from visible light rays, ultraviolet rays, far ultraviolet rays, X-rays, electron beams, γ-rays, molecular beams, ion beams and the like in accordance with the type of the photoacid generating agent used. In the case in which the underlayer film composition contains the photoacid generating agent and is subjected to exposure, the coated film can be effectively cured even at a normal temperature. In addition, the heating temperature is preferably about 90° C. to 350° C., and more preferably about 200° C. to 300° C. In the case in which the underlayer film composition contains the thermal acid generating agent, the coated film can be effectively cured even at, for example, about 90° C. to 150° C. The film thickness of the resist underlayer film provided in this step is preferably 0.1 μm to 5 μm.

Step (2)

In the resist pattern-forming step, pattern formation is carried out on the resist underlayer film provided in the resist underlayer film-providing step, using a resist composition solution. For example, the pattern-forming step may include: (2-1) a resist coating film-providing substep of coating the resist composition to obtain a coated film and subjecting the coated film to prebaking to provide a resist coating film; (2-2) an exposure substep of selectively exposing the resist coating film through a photomask; and (2-3) a developed resist coating film-forming substep of developing the exposed resist coating film. Hereinafter, each substep included in the aforementioned pattern-forming step will be explained.

(2-1) Resist Coating Film-Providing Substep

The resist composition solution is coated on the resist underlayer film, so that the resultant resist coating film has a predetermined film thickness. Thereafter, the resist composition is subjected to prebaking, and any solvent is evaporated to provide a resist coating film. The temperature of the prebaking in this substep is appropriately adjusted in accordance with the type, etc. of the resist composition, but is preferably about 30° C. to 200° C., and more preferably about 50° C. to 150° C.

Examples of the resist composition include: a chemically amplified type resist composition of positive or negative type that contains a photoacid generating agent; a positive type resist composition composed of an alkali-soluble resin and a quinone diazide-based photosensitizing agent; a negative type resist composition composed of an alkali-soluble resin and a crosslinking agent; and the like.

The resist composition used in providing the resist coating film on the resist underlayer film preferably has a solid content concentration of about 5 to 50% by mass, and is filtered through a filter with a pore size of, for example, about 0.2 μm before the provision of the resist coating film. Note that in this substep, commercially available resist compositions may be directly used as such a resist composition.

(2-2) Exposure Substep

A radioactive ray used for the exposure is appropriately selected from visible light rays, ultraviolet rays, far ultraviolet rays, X-rays, electron beams, g-rays, molecular beams, ion beams and the like in accordance with the type of the photoacid generating agent used in the resist composition. Far ultraviolet rays are referred, and particularly, a KrF excimer laser (248 nm), an ArF excimer laser (193 nm), an F2 excimer laser (wavelength: 157 nm), a $Kr_2$ excimer laser (wavelength: 147 nm), an ArKr excimer laser (wavelength: 134 nm), an extreme ultraviolet ray (wavelength: 13 nm, or the like) and the like are preferred.

(2-3) Development Substep

The predetermined resist pattern is formed by developing, washing, and drying the resist coating film after the exposure. In this substep, post-baking may be carried out after the exposure and before the development for the purpose of improving a resolution, a pattern profile, developability, and the like.

The developer solution used in this substep is appropriately selected in accordance with the type of the resist composition used. Examples of the developer solution in the case of the chemically amplified type resist composition of positive type or the positive type resist composition containing an alkali-soluble resin include an alkaline aqueous solution containing sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like. Moreover, an appropriate amount of a water-soluble organic solvent, for example, an alcohol such as methanol and ethanol, and/or a surfactant may be added to the alkaline aqueous solution.

It is to be noted that, as the pattern-forming step, the following methods can be used: a method in which a fine pattern is formed in the development substep (2-3) using a plurality of developer solutions after carrying out multiple times of the exposure substep (2-2) (see, for example, Japanese Unexamined Patent Application, Publication No. 2008-292975); and a method in which a fine pattern is formed after carrying out multiple times of the substeps (2-1) to (2-3) (for example, see Japanese Unexamined Patent Application, Publication No. 2011-053643). Alternatively, a pattern-forming method involving no development substep (2-3) such as a nanoimprint lithography process (for example, see Japanese Unexamined Patent Application, Publication No. 2010-262980) can be used.

Etching Step (iii)

Etching of the resist underlayer film is carried out with the obtained resist pattern as a mask, using a gas plasma such as oxygen plasma, for example. Further, etching of the substrate is carried out with the resist underlayer film as a mask. Accordingly, the predetermined pattern can be obtained.

EXAMPLES

Hereinafter, the present invention will be explained in more detail by way of Examples and Comparative Examples, but the present invention is by no means limited by these Examples and Comparative Examples.

Weight Average Molecular Weight (Mw)

Mw of the polymer was measured by gel permeation chromatography (detector: differential refractometer) using GPC columns manufactured by Tosoh Corporation (G2000HXL: x 2, and G3000HXL: x 1) under analytical conditions involving a flow rate of 1.0 mL/min, an elution solvent of tetrahydrofuran, and a column temperature of 40° C., using monodisperse polystyrene as a standard.

Synthesis of Component (A)

Synthesis Example 1

Into a separable flask equipped with a thermometer were charged 100 parts by mass of 2,7-dihydroxynaphthalene, 30 parts by mass of formalin, 1 part by mass of p-toluenesulfonic acid, and 150 parts by mass of propylene glycol monomethyl ether in a nitrogen atmosphere, and the polymerization was allowed to proceed at 80° C. for 6 hrs with stirring, to obtain a reaction solution. To the reaction solution were added 43 parts by mass of 1-adamantanol, and the mixture was stirred at 80° C. for 24 hrs. Thereafter, the reaction solution was diluted with 100 parts by mass of n-butyl acetate, and the organic layer was washed with a large amount of a mixed solvent of water/methanol (mass ratio: 1/2). Thereafter, the remaining solvent was distilled off to obtain a polymer (A-1). The polymer (A-1) had an Mw of 1,800.

Synthesis Examples 2 to 7

In a similar manner to Synthesis Example 1 except that the naphthalene derivative and the alcohol shown in Table 1 were blend in the specified amount, polymers (A-2) to (A-6) and (a-1) were obtained. Mw values of the respective obtained polymers are collectively shown in Table 1.

ethyl ether. Thereafter, the mixed solution was filtered through a membrane filter with a pore size of 0.1 μm, whereby a composition for forming a resist underlayer film was obtained. The composition for forming a resist underlayer film was used as a coating liquid to make the following various types of evaluations.

Examples 2 to 6 and Comparative Example 1

In a similar manner to Example 1 except that the polymer component shown in Table 2 was used in place of the polymer (A-1), each composition for forming a resist underlayer film was obtained. The obtained compositions for forming a resist underlayer film were used as a coating liquid to make the following various types of evaluations.

Example 7

A mixed solution was prepared by dissolving 10 parts of the polymer (A-1), 5 parts of (C-1) diphenyliodonium trifluo-

TABLE 1

| | | Naphthalene derivative | | Alcohol | | Physical property Mw |
|---|---|---|---|---|---|---|
| | (A) Component | type | using amount (parts by mass) | type | using amount (parts by mass) | |
| Synthesis Example 1 | A-1 | 2,7-dihydroxynaphthalene | 100 | 1-adamantanol | 43 | 1,800 |
| Synthesis Example 2 | A-2 | 2,7-dihydroxynaphthalene | 100 | 1,3-adamantanediol | 43 | 1,900 |
| Synthesis Example 3 | A-3 | 2,7-dihydroxynaphthalene | 100 | 1,3,5-adamantanetriol | 43 | 2,000 |
| Synthesis Example 4 | A-4 | 2,7-dihydroxynaphthalene | 100 | 1-adamantanemethanol | 43 | 2,200 |
| Synthesis Example 5 | A-5 | 2,7-dihydroxynaphthalene | 100 | 1,3-adamantanedimethanol | 43 | 1,900 |
| Synthesis Example 6 | A-6 | 2,7-dihydroxynaphthalene | 100 | 1,3,5-adamantanetrimethanol | 43 | 2,000 |
| Synthesis Example 7 | a-1 | 2,7-dihydroxynaphthalene | 100 | — | — | 1,800 |

Preparation of Resist Composition for ArF

Synthesis Example 8

Into a separable flask equipped with a reflux condenser were charged 29 parts of 8-methyl-8-t-butoxycarbonyl-methoxycarbonyltetracyclo[$4.4.0.1^{2,5}.1^{7,10}$]dodeca-3-ene (monomer (a)), 10 parts of 8-methyl-8-hydroxytetracyclo[$4.4.0.1^{2,5}.1^{7,10}$]dodeca-3-ene (monomer (b)), 18 parts of maleic anhydride (monomer (c)), 4 parts of 2,5-dimethyl-2,5-hexanediol diacrylate, 1 part of t-dodecyl mercaptan, 4 parts of azobisisobutyronitrile, and 60 parts of 1,2-diethoxyethane in a stream of nitrogen, and the polymerization was allowed to proceed at 70° C. for 6 hrs with stirring. Thereafter, the reaction solution was poured into a large amount of a mixed solvent of n-hexane/i-propyl alcohol (mass ratio=1/1), whereby the resin was solidified. The solidified resin was washed with the mixed solvent several times, and thereafter dried under vacuum. The polymer had a molar ratio of each repeating unit derived from the monomers (a), (b) and (c) of 64:18:18, and an Mw of 27,000 (60% yield).

Preparation of Composition for Forming a Resist Underlayer Film

Example 1

A mixed solution was prepared by dissolving 10 parts of the polymer (A-1) in 100 parts of propylene glycol monomromethanesulfonate as the acid generating agent (C), 10 parts of (D-1) Nikaluck N-2702 (manufactured by Sanwa Chemical Co., Ltd.) as the crosslinking agent (D) in 100 parts of propylene glycol monomethyl ether. Thereafter, the mixed solution was filtered through a membrane filter with a pore size of 0.1 μm, whereby a composition for forming a resist underlayer film was obtained. The composition for forming a resist underlayer film was used as a coating liquid to make the following various types of evaluations.

Examples 8 to 9

In a similar manner to Example 7 except that the polymer component shown in Table 2 was used in place of the polymer (A-1), each composition for forming a resist underlayer film was obtained. The obtained compositions for forming a resist underlayer film were used as a coating liquid to make the following various types of evaluations.

Formation of Resist Pattern

Each composition for forming a resist underlayer film was coated on a silicon wafer having a diameter of 8 inches by a spin-coating process. Next, the composition for forming a resist underlayer film was heated on a hot plate at 180° C. for 60 sec. Subsequently, heating was continued at 350° C. for 60 sec, whereby an underlayer film with a film thickness of 0.3 μm was provided. Next, an intermediate layer composition solution for three-layer resist process (NFC SOG080, manufactured by JSR Corporation) was spin-coated on the underlayer film, and heated on a hot plate at 200° C. for 60 sec. Subsequently, heating was continued at 300° C. for 60 sec, whereby an intermediate layer coating film with a film thickness of 0.05 μm was provided. Next, the resist composition prepared above was spin-coated on the intermediate layer coating film, and subjected to prebaking on a hot plate at 130° C. for 90 sec, whereby a resist coating film with a film thickness of 0.2 μm was provided.

Next, the resist coating film was exposed using an ArF excimer laser lithography device (lens numerical aperture: 0.78; exposure wavelength: 193 nm) manufactured by Nikon, through a mask pattern for a period of an optimum exposure time. Next, the resist coating film was subjected to postbaking using a hot plate at 130° C. for 90 sec, and thereafter was developed at 25° C. for 1 min using an aqueous tetramethylammonium hydroxide solution having a concentration of 2.38% by mass. Thereafter, the resist coating film was washed with water and dried, whereby a resist coating film having a positive type resist pattern formed thereon was obtained.

Evaluations

Pattern Configuration

Pattern configuration in the resist coating film having a positive type resist pattern formed thereon was observed with a scanning electron microscope, and evaluations were made in accordance with the following criteria: favorable (A) in the case of the observed pattern configuration being rectangular; and unfavorable (B) in the case of the observed pattern configuration being in a shape other than a rectangle (for example, T-top, scum, or the like).

Standing Wave Prevention Effect

Presence or absence of an influence of a standing wave on the resist coating film having a positive type resist pattern formed thereon was observed with a scanning electron microscope, and the standing wave prevention effect was evaluated in accordance with the following criteria: favorable (A) in the case of the standing wave reflected from the underlayer film not being observed on a lateral face of the pattern; and unfavorable (B) in the case of the standing wave being observed on a lateral face of the pattern.

Optical Characteristics

Each composition for forming a resist underlayer film was spin-coated on a silicon wafer having a diameter of 8 inches. Thereafter, the composition for forming a resist underlayer film was heated using a hot plate at 300° C. for 120 sec, whereby an underlayer film with a film thickness of 0.3 μm was provided. A refractive index (n) and an absorbance (extinction coefficient (k)) at a wavelength of 193 nm were measured on the underlayer film using a spectroscopic ellipsometer VUV-VASE manufactured by J. A. Woollam Co. Inc.

Etching Resistance

The composition for forming a resist underlayer film was spin-coated on a silicon wafer having a diameter of 8 inches by a spin coating process, whereby an underlayer film with a film thickness of 300 nm was provided. Thereafter, the underlayer film was subjected to an etching treatment (pressure: 0.03 Torr; high frequency power: 3000 W; $Ar/CF_4$=40/100 sccm; and substrate temperature: 20° C.), and the film thickness of the underlayer film after the etching treatment was measured. Then, the etching rate (nm/min) was calculated from the relationship between the decrement of the film thickness and the treatment time. Note that the etching resistance was evaluated to be superior in the case of the etching rate being low.

Furthermore, in the case of a resist underlayer film having a refractive index (n) within a range of no less than 1.40 and no greater than 1.60, it may be determined that the resist underlayer film sufficiently functions as an antireflective film in an ArF exposure resist step. In addition, in the case of a resist underlayer film having an extinction coefficient (k) within a range of no less than 0.25 and no greater than 0.40, it may be determined that the resist underlayer film sufficiently functions as an antireflective film in the ArF exposure resist step.

TABLE 2

| | (A) Component | (C) Component | (D) Component | Evaluations | | | | |
|---|---|---|---|---|---|---|---|---|
| | | | | pattern configuration | standing wave prevention effect | refractive index (n) | extinction coefficient (k) | etching rate (nm/min) |
| Example 1 | A-1 | — | — | A | A | 1.49 | 0.39 | 0.90 |
| Example 2 | A-2 | — | — | A | A | 1.47 | 0.40 | 0.91 |
| Example 3 | A-3 | — | — | A | A | 1.46 | 0.38 | 0.90 |
| Example 4 | A-4 | — | — | A | A | 1.50 | 0.39 | 0.89 |
| Example 5 | A-5 | — | — | A | A | 1.48 | 0.40 | 0.91 |
| Example 6 | A-6 | — | — | A | A | 1.50 | 0.39 | 0.90 |
| Example 7 | A-1 | C-1 | D-1 | A | A | 1.51 | 0.40 | 0.89 |
| Example 8 | A-2 | C-1 | D-1 | A | A | 1.48 | 0.41 | 0.90 |
| Example 9 | A-3 | C-1 | D-1 | A | A | 1.47 | 0.39 | 0.89 |
| Comparative Example 1 | a-1 | — | — | B | B | 1.38 | 0.45 | 1.00 |

As is clear from Table 2, the compositions for forming a resist underlayer film of Examples 1 to 9 were capable of providing a resist underlayer film that had superior etching resistance and a reduced reflectance (more specifically, a high refractive index n and a low extinction coefficient k) as compared with the composition for forming a resist underlayer film of Comparative Example 1. In addition, it was found that the resist patterns formed using the composition for forming a resist underlayer film of Examples 1 to 9 were more superior in terms of pattern configuration as compared with Comparative Example 1.

The composition for forming a resist underlayer film according to the embodiment of the present invention is suitable as a material for providing an underlayer film for use in microfabrication in lithography processes, particularly in multilayer resist processes that are suitable for production of large scale integrated circuit devices. Furthermore, the pattern-forming method according to the embodiment of the present invention is suitable as a pattern-forming method in the microfabrication in lithography processes, particularly in the multilayer resist processes that are suitable for production of the large scale integrated circuit devices.

Obviously, numerous modifications and variations of the present invention are possible in light of the above teachings.

It is therefore to be understood that within the scope of the appended claims, the invention may be practiced otherwise than as specifically described herein.

What is claimed is:

1. A composition for forming a resist underlayer film, comprising:
   a polymer comprising a repeating unit represented by formula (1); and
   a solvent,

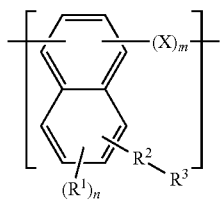

wherein, in the formula (1), $R^1$ represents a hydroxy group, an alkyl group having 1 to 6 carbon atoms, an alkoxy group having 1 to 6 carbon atoms, an acyl group having 2 to 10 carbon atoms or an aryl group having 6 to 14 carbon atoms; n is an integer of 0 to 5, wherein in a case where n is no less than 2, a plurality of $R^1$s are identical or different; X represents a divalent hydrocarbon group having 1 to 20 carbon atoms or an alkanediyloxy group having 1 to 20 carbon atoms; m is an integer of 1 to 7, wherein in a case where m is no less than 2, a plurality of Xs are identical or different; a sum of m and n is no greater than 7; $R^2$ represents a single bond or an alkanediyl group having 1 to 4 carbon atoms; and $R^3$ represents an alicyclic group having 4 to 20 carbon atoms or an aryl group having 6 to 30 carbon atoms, wherein a part or all of hydrogen atoms included in the alicyclic group or the aryl group represented by $R^3$ are substituted with a hydroxy group, an alkyl group having 1 to 6 carbon atoms, an alkoxy group having 1 to 6 carbon atoms, an acyl group having 1 to 6 carbon atoms or a hydroxyalkyl group having 1 to 6 carbon atoms.

2. The composition according to claim 1, wherein the formula (1) is represented by formula (1-1),

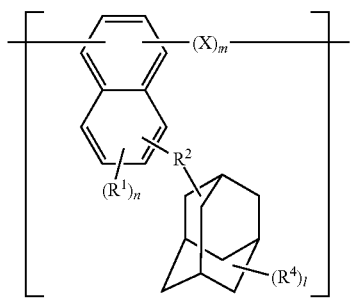

wherein, in the formula (1-1), $R^1$, $R^2$, X, m and n are as defined in the formula (1); $R^4$ represents a hydroxy group, an alkyl group having 1 to 6 carbon atoms, an alkoxy group having 1 to 6 carbon atoms, an acyl group having 2 to 6 carbon atoms or a hydroxyalkyl group having 1 to 6 carbon atoms; and l is an integer of 1 to 3, wherein in a case where l is no less than 2, a plurality of $R^4$s are identical or different.

3. The composition according to claim 2, wherein a weight average molecular weight of the polymer is 500 to 8,000.

4. The composition according to claim 2, further comprising an acid generating agent.

5. The composition according to claim 4, wherein an amount of the acid generating agent with respect to 100 parts by mass of a solid content of the composition is from 0.1 to 5 parts by mass.

6. The composition according to claim 2, further comprising a crosslinking agent.

7. The composition according to claim 6, wherein an amount of the cross linking agent with respect to 100 parts by mass of a solid content of the composition is no greater than 50 parts by mass.

8. The composition according to claim 2, wherein $R^4$ represents a hydroxy group or a hydroxyalkyl group having 1 to 6 carbon atoms.

9. A pattern-forming method comprising:
   coating the composition according to claim 2 on a substrate, to provide a resist underlayer film;
   forming a resist pattern on the substrate using a resist composition, the substrate having the resist underlayer film provided on the substrate; and
   etching the resist underlayer film and the substrate.

10. The composition according to claim 1, wherein a weight average molecular weight of the polymer is 500 to 8,000.

11. The composition according to claim 1, further comprising an acid generating agent.

12. The composition according to claim 11, wherein an amount of the acid generating agent with respect to 100 parts by mass of a solid content of the composition is from 0.1 to 5 parts by mass.

13. The composition according to claim 1, further comprising a crosslinking agent.

14. The composition according to claim 13, wherein an amount of the cross linking agent with respect to 100 parts by mass of a solid content of the composition is no greater than 50 parts by mass.

15. A pattern-forming method comprising:
   coating the composition according to claim 1 on a substrate, to provide a resist underlayer film;
   forming a resist pattern on the substrate using a resist composition, the substrate having the resist underlayer film provided on the substrate; and
   etching the resist underlayer film and the substrate.

16. The composition according to claim 1, wherein a part or all of hydrogen atoms included in the alicyclic group or the aryl group represented by $R^3$ are substituted with a hydroxy group.

* * * * *